US012682934B2

(12) United States Patent
Lin et al.

(10) Patent No.: US 12,682,934 B2
(45) Date of Patent: Jul. 14, 2026

(54) ELECTRONIC DEVICE

(71) Applicant: ASRock Industrial Computer Corporation, Taipei City (TW)

(72) Inventors: I-Ming Lin, Taipei City (TW); Yi-Shu Hsieh, Taipei City (TW); Chia-Hon Ju, Taipei City (TW); Ming-Jie Lee, Taipei City (TW)

(73) Assignee: ASRock Industrial Computer Corporation, Taipei City (TW)

( * ) Notice: Subject to any disclaimer, the term of this patent is extended or adjusted under 35 U.S.C. 154(b) by 78 days.

(21) Appl. No.: 18/969,429

(22) Filed: Dec. 5, 2024

(65) Prior Publication Data

US 2025/0246209 A1      Jul. 31, 2025

(30) Foreign Application Priority Data

Jan. 29, 2024    (TW) ................................. 113201000

(51) Int. Cl.
| | |
|---|---|
| *G06F 1/16* | (2006.01) |
| *G06F 1/20* | (2006.01) |
| *G11B 33/14* | (2006.01) |
| *H05K 5/00* | (2025.01) |
| *H05K 7/00* | (2006.01) |
| *H05K 7/20* | (2006.01) |

(52) U.S. Cl.
CPC .......... *G11B 33/1426* (2013.01); *G06F 1/206* (2013.01); *H05K 7/2039* (2013.01)

(58) Field of Classification Search
CPC ..... G11B 33/1426; G06F 1/206; G06F 1/203; G06F 1/20; G06F 1/1656; G06F 1/1658; H05K 7/2039; H05K 7/20436; H05K 7/20445; H05K 7/20472
See application file for complete search history.

(56) References Cited

U.S. PATENT DOCUMENTS 6,069,792 A * 5/2000 Nelik ...................... G06F 1/184
                                              361/679.48
6,490,157 B2 * 12/2002 Unrein ...................... G06F 1/20
                                              361/679.46

(Continued)

FOREIGN PATENT DOCUMENTS

TW        202121965 A      6/2021

*Primary Examiner* — Anthony M Haughton
(74) *Attorney, Agent, or Firm* — Li & Cai Intellectual Property (USA) Office

(57) ABSTRACT

An electronic device includes a heat-dissipation bottom plate, a metal carrier disposed on the heat-dissipation bottom plate, a plurality of first thermally conductive pads assembled to the metal carrier, and a second thermally conductive pad that is assembled to the metal carrier. The metal carrier has an accommodating space configured to allow a hard disk drive (HDD) to be assembled therein. A memory module and at least one interface card are connected to the metal carrier through the first thermally conductive pads. The metal carrier or the HDD is connected to the heat-dissipation bottom plate through the second thermally conductive pad. The HDD, the memory module, and the at least one interface card are in cooperation with the first thermally conductive pads, the metal carrier, the second thermally conductive pad, and the heat-dissipation bottom plate for heat-dissipation.

10 Claims, 10 Drawing Sheets

(56) References Cited

U.S. PATENT DOCUMENTS

| | | | |
|---|---|---|---|
| 6,549,397 B1* | 4/2003 | Diaz ...................... | G06F 1/188 |
| | | | 312/223.1 |
| 7,701,705 B1* | 4/2010 | Szeremeta ........... | G11B 33/123 |
| | | | 248/633 |
| 9,594,409 B1* | 3/2017 | Szeremeta ............... | G06F 1/20 |
| 9,699,923 B1* | 7/2017 | Cariker ............... | H05K 1/0274 |
| 9,961,788 B2* | 5/2018 | Sullivan .................. | G06F 1/181 |
| 10,764,990 B1* | 9/2020 | Chen ...................... | H05K 1/021 |
| 12,419,519 B2* | 9/2025 | Dong ...................... | A61B 5/00 |
| 12,581,609 B1* | 3/2026 | Cadorin Falleiros ........................ | |
| | | | H05K 7/1435 |
| 2006/0215357 A1* | 9/2006 | Green ............... | G11B 33/1426 |
| | | | 361/678 |
| 2007/0008706 A1* | 1/2007 | Lai ........................... | H05K 5/10 |
| | | | 361/752 |
| 2007/0293954 A1* | 12/2007 | Pfingsten ............. | H01R 13/514 |
| | | | 361/728 |
| 2008/0002346 A1* | 1/2008 | Lin ......................... | G06F 1/181 |
| | | | 361/735 |
| 2009/0279246 A1* | 11/2009 | Nguyen ............. | G11B 33/1426 |
| | | | 361/679.54 |
| 2012/0151098 A1* | 6/2012 | Sullivan .................. | G06F 1/183 |
| | | | 710/13 |
| 2014/0022733 A1* | 1/2014 | Lim .................. | H05K 7/20445 |
| | | | 361/718 |
| 2014/0306586 A1* | 10/2014 | Sullivan .................. | H05K 5/10 |
| | | | 312/223.2 |
| 2016/0198565 A1* | 7/2016 | Smith ...................... | G06F 1/20 |
| | | | 361/679.34 |
| 2016/0295743 A1* | 10/2016 | Yu .............................. | G06F 1/20 |
| 2020/0075453 A1* | 3/2020 | Kim ...................... | H10W 40/22 |
| 2020/0236812 A1* | 7/2020 | Smith ............... | H05K 7/20445 |
| 2025/0142770 A1* | 5/2025 | Hu .................... | H05K 7/20254 |

* cited by examiner

ELECTRONIC DEVICE

CROSS-REFERENCE TO RELATED PATENT APPLICATION

This application claims the benefit of priority to Taiwan Patent Application No. 113201000, filed on Jan. 29, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic device, and more particularly to an electronic device having a heat-dissipation structure.

BACKGROUND OF THE DISCLOSURE

In the related art, since the interface cards provided in a conventional electronic device are designed by different manufacturers, the size and height of the interface cards are not uniform and cannot be easily applied to every system. Although the copper sheets or the aluminum sheets are added to the above interface cards during development to enhance heat dissipation, the effectiveness in providing adequate heat-storage space and heat-dissipation area may be limited by the occupied volume of the copper sheets or the aluminum sheets.

SUMMARY OF THE DISCLOSURE

In response to the above-referenced technical inadequacies, the present disclosure provides an electronic device for effectively improving on the issues associated with conventional electronic devices.

In order to solve the above-mentioned problems, one of the technical aspects adopted by the present disclosure is to provide an electronic device for heat-dissipation of at least one of a hard disk drive (HDD), a memory module, and at least one interface card. The electronic device includes a heat-dissipation bottom plate, a metal carrier, a plurality of first thermally conductive pads, and a second thermally conductive pad. The metal carrier is disposed on the heat-dissipation bottom plate and has an accommodating space that allows the HDD to be assembled therein. The metal carrier has a first surface and a second surface respectively arranged at two opposite sides of the accommodating space. The first thermally conductive pads are assembled to the first surface of the metal carrier. The memory module and the at least one interface card are connected to the metal carrier through the first thermally conductive pads. The second thermally conductive pad is assembled to the second surface of the metal carrier. The metal carrier or the HDD is connected to the heat-dissipation bottom plate through the second thermally conductive pad. The HDD, the memory module, and the at least one interface card are in cooperation with the first thermally conductive pads, the metal carrier, the second thermally conductive pad, and the heat-dissipation bottom plate for heat-dissipation.

Therefore, in the electronic device provided by the present disclosure, the heat-dissipation bottom plate, the metal carrier, the first thermally conductive pads, and the second thermally conductive pad are structurally cooperated with each other for enabling the electronic device to be applied to the different brands of the electronic components (e.g., the memory modules or the interface cards) and for enabling the electronic device to provide a large heat-storage space and a large heat-dissipation area, thereby having a better heat-dissipation performance.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
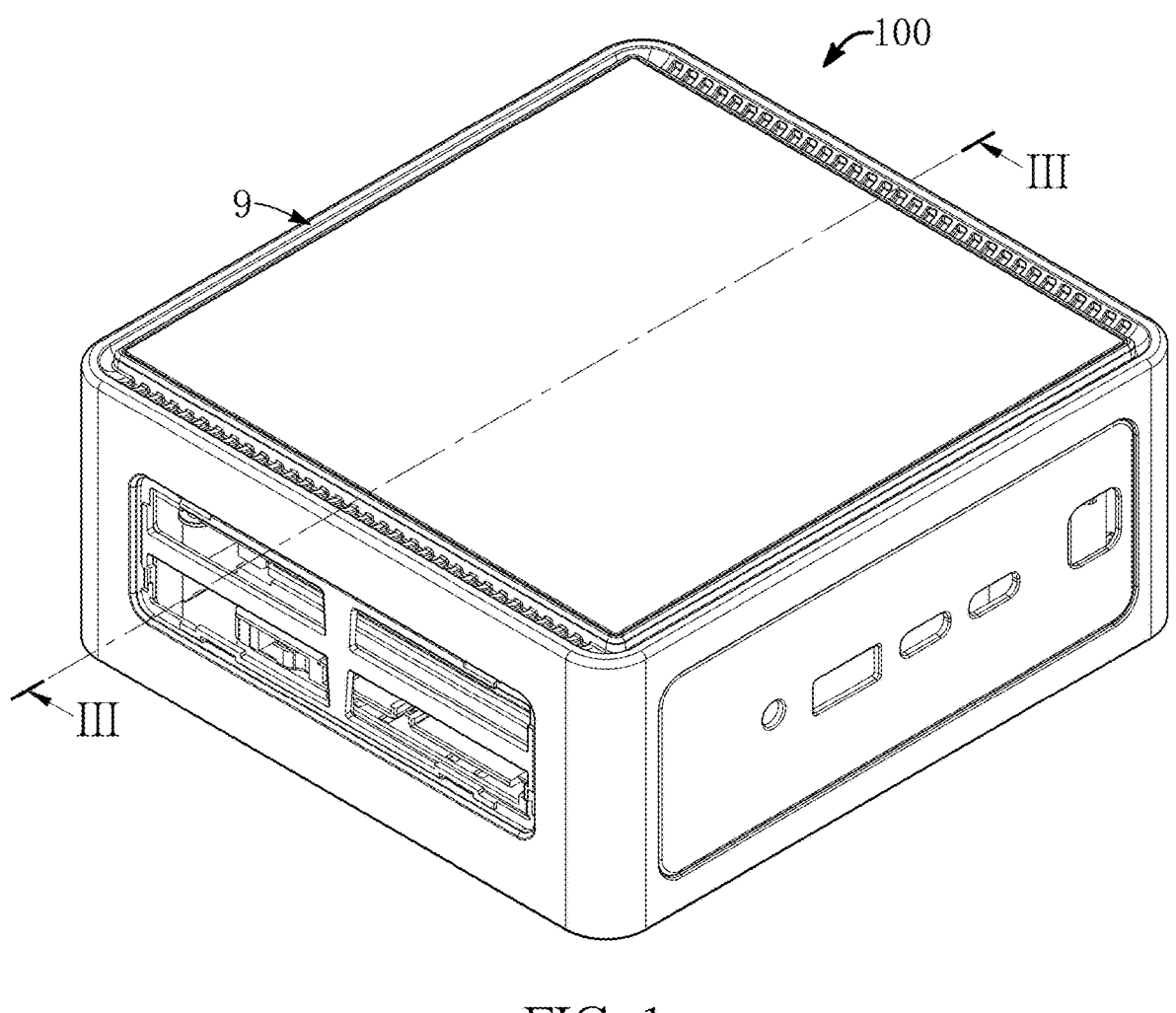
FIG. 1 is a schematic view of an electronic device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure is provided. The present embodiment provides an electronic device 100 for heat-dissipation of at least one (or an assembly) of a hard disk drive (HDD) 1, a memory module 2, and at least one interface card 3. It should be noted that the HDD 1, the memory module 2, and the at least one interface card 3 in the present embodiment can be interior components of the electronic device 100.

Figure 2:
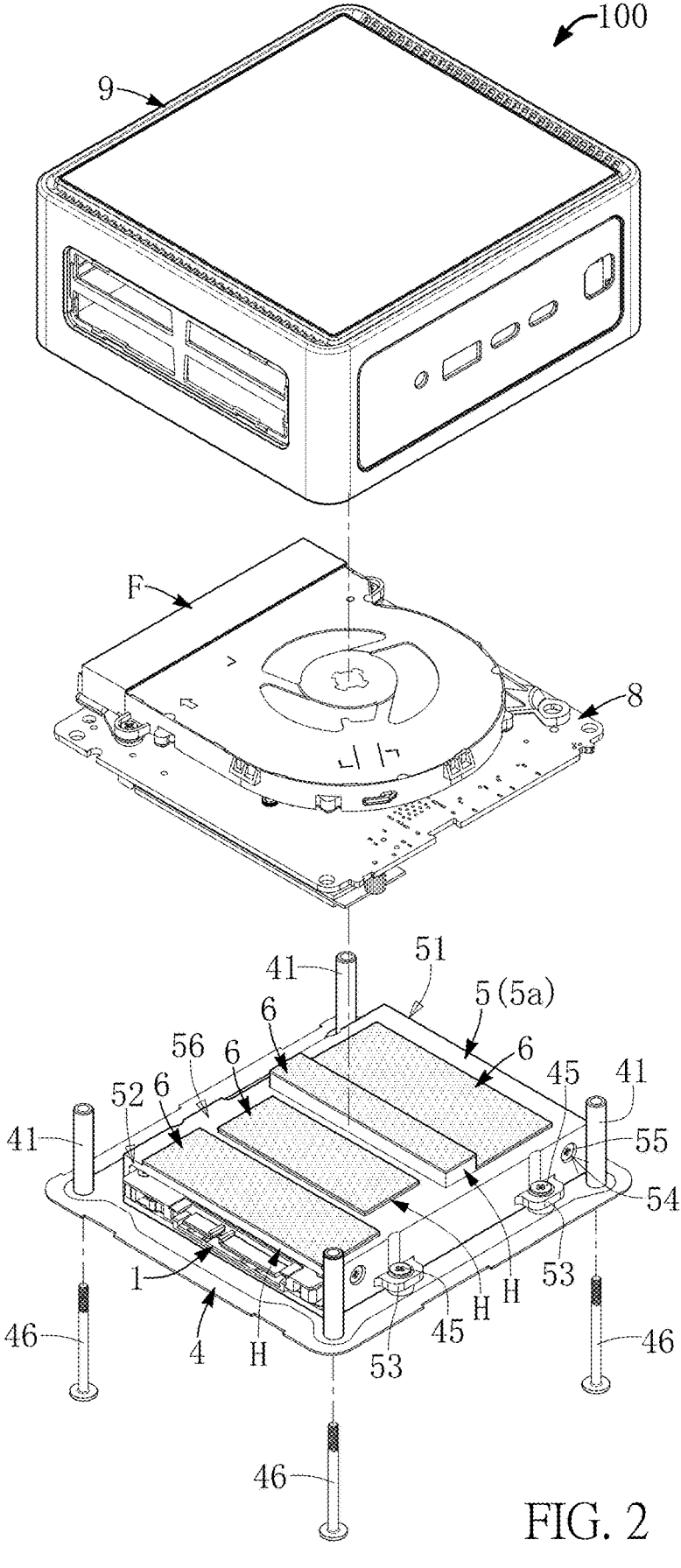
FIG. 2 is a schematic exploded view of FIG. 1.
Figure 3:
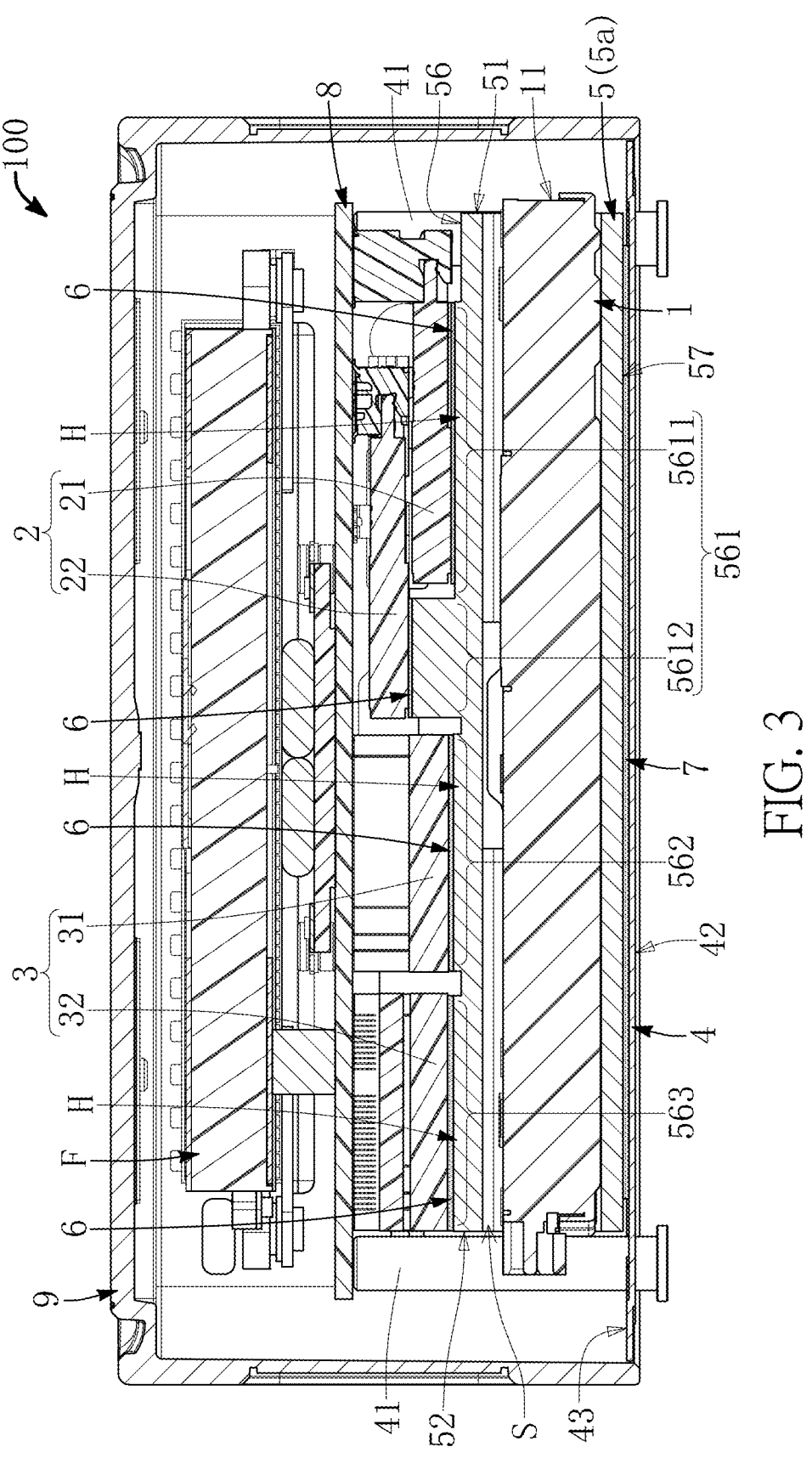
FIG. 3 is a schematic cross-sectional view taken along line III-III of FIG. 2.

As shown in FIG. 1 to FIG. 3, the electronic device 100 in the present embodiment is a portable electronic device or a handheld electronic device (e.g., a handheld industrial computer). The electronic device 100 includes a heat-dissipation bottom plate 4, a metal carrier 5 disposed on the heat-dissipation bottom plate 4, a plurality of first thermally conductive pads 6 assembled to the metal carrier 5, a second thermally conductive pad 7 disposed between the heat-dissipation bottom plate 4 and the metal carrier 5, a circuit board 8 arranged above the heat-dissipation bottom plate 1, a fan F assembled to a top side of the circuit board 8, the memory module 2 and the at least one interface card 3 assembled to a bottom side of the circuit board 8, the HDD 1 disposed in the metal carrier 5, and a housing 9 that covers (or shields) the heat-dissipation bottom plate 4, but the present disclosure is not limited thereto. For example, in other embodiments of the present disclosure not shown in the drawings, the fan F, the circuit board 8, and the housing 9 can be adjusted or omitted according to practical requirements.

Figure 4:
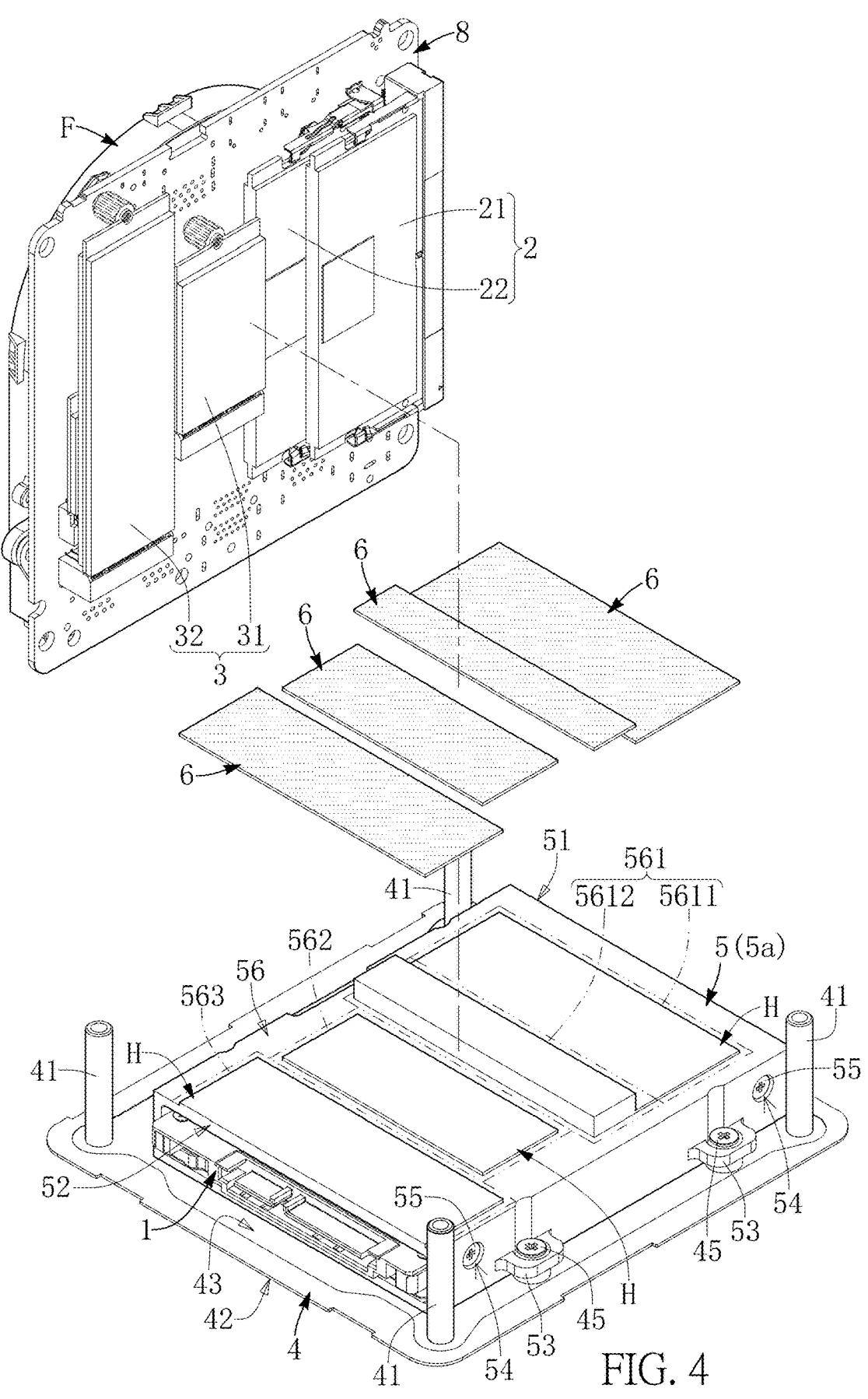
FIG. 4 is a schematic exploded view of FIG. 1 in which a housing is omitted.
Figure 5:
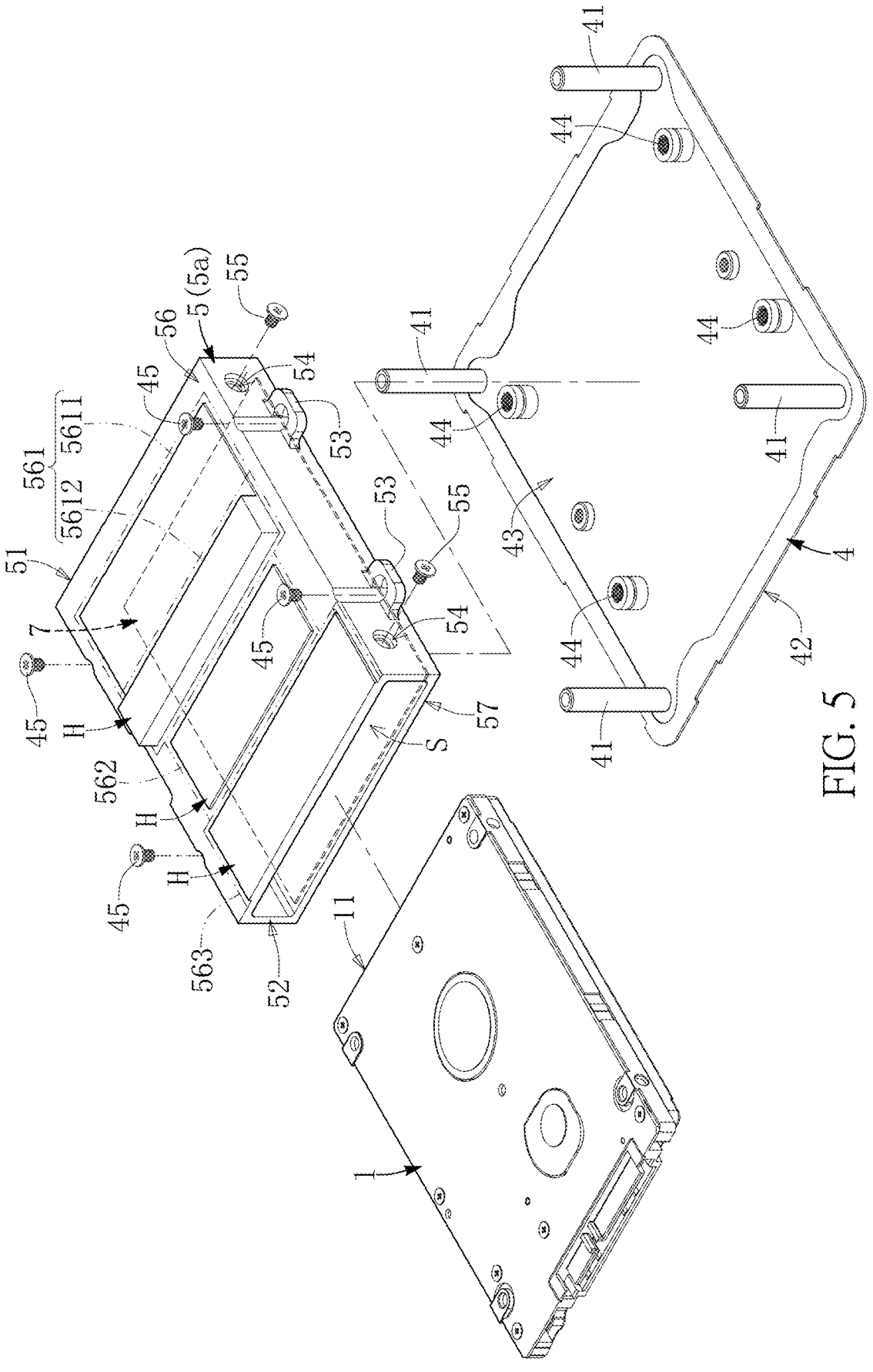
FIG. 5 is a schematic exploded view of FIG. 1 in which the housing, a fan, and a circuit board are omitted.
Figure 6:
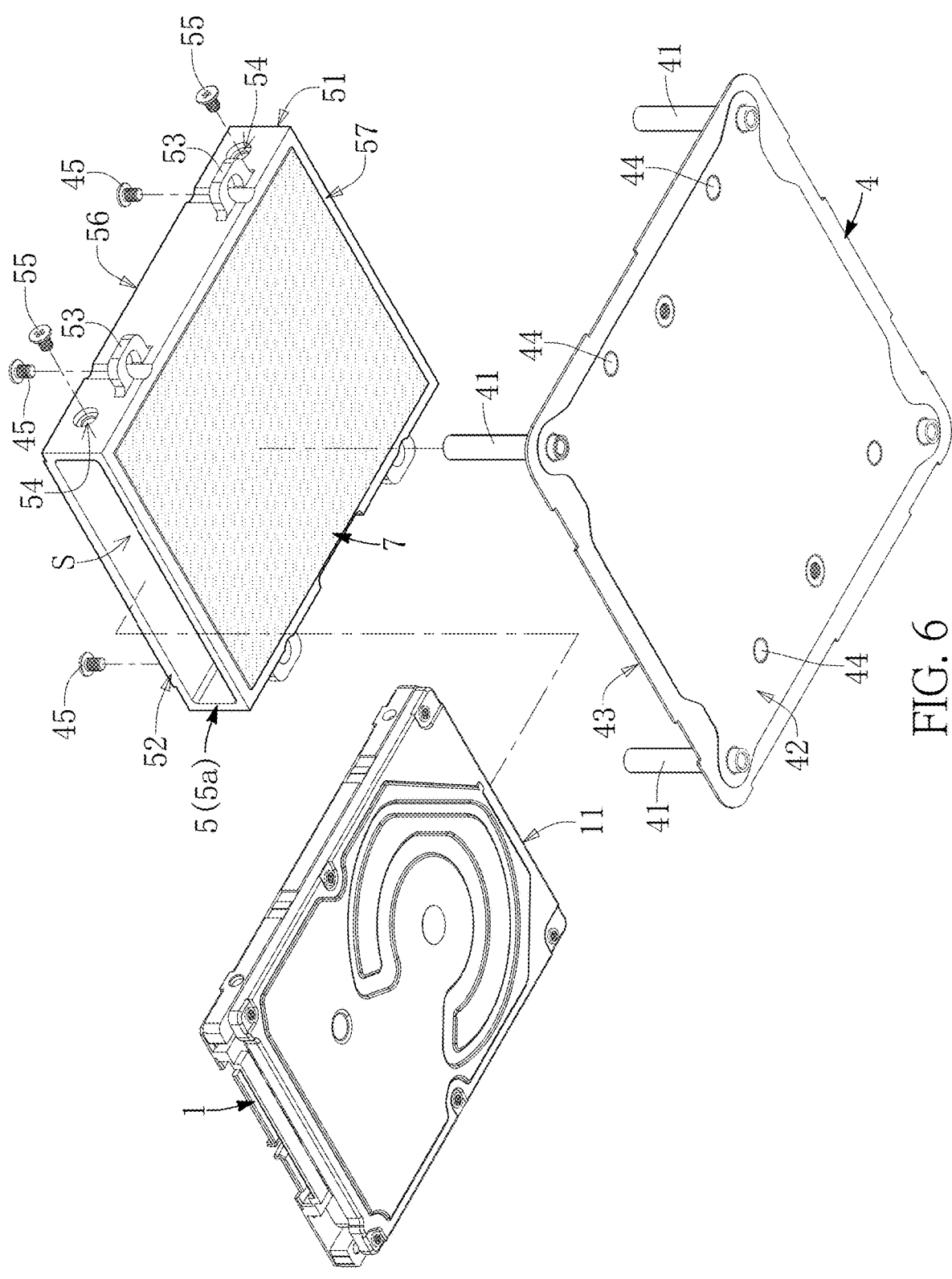
FIG. 6 is a schematic exploded view of FIG. 5 from another angle of view.

As shown in FIG. 4 to FIG. 6, the housing 9 is assembled to the heat-dissipation bottom plate 4 for covering (or shielding) other components of the electronic device 100. The heat-dissipation bottom plate 4 is substantially a rectangular plate-shaped structure and has an outer surface 42 and an inner surface 43 that is opposite to the outer surface 42. The outer surface 42 is arranged away from the metal carrier 5 and is exposed from the handheld electronic device, and the inner surface 43 is provided with (or adjacent to) the metal carrier 5.

Specifically, the heat-dissipation bottom plate 4 includes a plurality of stands 41 respectively arranged on four corners thereof, and the circuit board 8 can be threaded to the stands 41 through second screws 46. Each of two long sides of the heat-dissipation bottom plate 4 is provided with two threaded holes 44, and the metal carrier 5 is threaded to the threaded holes 44 of the heat-dissipation bottom plate 4 through first screws 45, such that the metal carrier 5 is located between the heat-dissipation bottom plate 4 and the circuit board 8. In addition, a quantity of the stands 41, the threaded holes 44, the first screws 45, and the second screws 46 can be adjusted or provided according to practical requirements, and the present disclosure is not limited thereto.

As shown in FIG. 5, the metal carrier 5 has an accommodating space S that allows the HDD 1 to be assembled therein. Specifically, the metal carrier 5 has a front segment 51 and a rear segment 52 that is opposite to the front segment 51. The HDD 1 is inserted into the accommodating space S through a front edge 11 thereof, such that the front edge 11 is located adjacent to the front segment 51. The metal carrier 5 has a plurality of positioning tabs 53 that are respectively arranged on two opposite sides thereof for allowing the metal carrier 5 to be threaded to the heat-dissipation bottom plate 4 through the first screws 45. Each lateral surface of the metal carrier 5 further has two threaded holes 54 for allowing the HDD 1 to be threaded in the accommodating space S of the metal carrier 5 through the third screws 55. In addition, a quantity of the positioning tabs 53, the threaded holes 54, and the third screws 55 can be adjusted or provided according to practical requirements, and the present disclosure is not limited thereto.

The electronic device 100 further includes at least one heat-dissipation metal H. In the present embodiment, the metal carrier 5 is an aluminum extrusion 5*a*, and the metal carrier 5 and the at least one heat-dissipation metal H are integrally formed as a single one-piece structure. In other words, the metal carrier 5 and the at least one heat-dissipation metal H of the present embodiment are manufactured in an aluminum extrusion structure by being extruded, and cannot be separated from each other. The metal carrier 5 further has a first surface 56 and a second surface 57 respectively arranged at two opposite sides of the accommodating space S. The first surface 56 is arranged adjacent to the circuit board 8, and the second surface 57 is arranged adjacent to the heat-dissipation bottom plate 4. In other embodiments of the present disclosure, the metal carrier 5 and the at least one heat-dissipation metal H can be two independent components that are detachable from each other, and the at least one heat-dissipation metal H is disposed on the metal carrier 5.

As shown in FIG. 4, the surfaces of the memory module 2 and the at least one interface card 3 arranged away from the at least one heat-dissipation metal H are fixed onto the circuit board 8. When the circuit board 8 is assembled to the heat-dissipation bottom plate 4, the memory module 2 and the at least one interface card 3 can be thermally conducted and heat-dissipated through the first thermally conductive pads 6 and the at least one heat-dissipation metal H. The first thermally conductive pads 6 can be the rectangular sheets of different sizes, and are assembled to the first surface 56 of the metal carrier 5.

As shown in FIG. 6, the second thermally conductive pad 7 is substantially a rectangular sheet and has a size being substantially identical to that of the second surface 57 of the metal carrier 5. The second thermally conductive pad 7 is assembled to the second surface 57 of the metal carrier 5, and the metal carrier 5 is disposed on the heat-dissipation bottom plate 4 through the second thermally conductive pad 7. The sizes or shapes of the first thermally conductive pads 6 or the second thermally conductive pad 7 can be adjusted according to practical requirements, and the present disclosure is not limited thereto.

Accordingly, the heat generated by the memory module 2 and the at least one interface card 3 can be transmitted to the metal carrier 5 through the first thermally conductive pads 6, and the metal carrier 5 can be used to transmit heat to the heat-dissipation bottom plate 4 through the second thermally conductive pad 7, such that the heat generated by the memory module 2 and the at least one interface card 3 can be transmitted to the heat-dissipation bottom plate 4 through the first thermally conductive pads 6, the metal carrier 5, and the second thermally conductive pad 7, thereby the heat can be transmitted to an external space through the heat-dissipation bottom plate 4.

It should be noted that, when the electronic device 100 further includes the at least one heat-dissipation metal H, the memory module 2 or the at least one interface card 3 are in heat-dissipation through the first thermally conductive pads 6 and the at least one heat-dissipation metal H in sequence.

As shown in FIG. 4, the first surface 56 of the metal carrier 5 has a first portion 561 and a second portion 562 that is arranged adjacent to the first portion 561. Specifically, the first surface 56 further has a third portion 563. The second portion 562 is arranged between the first portion 561 and the third portion 563, and an area of the first portion 561 is slightly greater than any one of an area of the second portion 562 and an area of the third portion 563.

The first portion 561 is configured to carry (or to be connected to) the memory module 2 that can be a small outline dual in-line memory module (SODIMM), but the present disclosure is not limited thereto. Specifically, the memory module 2 includes a first memory 21 and a second memory 22 that is stacked on the first memory 21. The first memory 21 and the second memory 22 are parallel to each other and are disposed on the first portion 561 of the first surface 56. The first memory 21 is arranged closer to the metal carrier 5 than the second memory 22.

Specifically, as shown in FIG. 4, the first portion 561 of the first surface 56 further has a first stair 5611 and a second stair 5612 that is connected to the first stair 5611. The first stair 5611 and the second stair 5612 are arranged at different heights, and the second stair 5612 is slightly higher than the first stair 5611 with respect to the heat-dissipation bottom plate 4. Each of the first stair 5611 and the second stair 5612 is provided with one of the first thermally conductive pads 6 thereon. Moreover, the first stair 5611 and the second stair 5612 are arranged on the front segment 51 of the metal carrier 5, and the second stair 5612 of the first portion 561 is arranged adjacent to the second portion 562.

The first stair 5611 is configured to carry the first memory 21, the second stair 5612 is configured to carry the second memory 22, and the first memory 21 and the second memory 22 are thermally conductive through the first stair 5611 and the second stair 5612 (or through the first thermally conductive pads 6 disposed on the first stair 5611 and the second stair 5612), respectively.

The second portion 562 and the third portion 563 are configured to carry the at least one interface card 3 that can be a M.2 solid state drive (SSD). Specifically, the at least one interface card 3 can include a first interface card 31 having a first size and a second interface card 32 that has a second size being different from the first size. In the present embodiment, the first size is smaller than the second size, but the present disclosure is not limited thereto. The first interface card 31 is disposed on the second portion 562, and the second interface card 32 is disposed on the third portion 563.

In summary, the HDD 1, the memory module 2, the at least one interface card 3 are in cooperation with the first thermally conductive pads 6, the metal carrier 5, the second thermally conductive pad 7, and the heat-dissipation bottom plate 4 for heat-dissipation, thereby enabling the electronic device 100 to provide a large heat-storage space and a large heat-dissipation area for having a better heat-dissipation performance.

Second Embodiment

Figure 7:
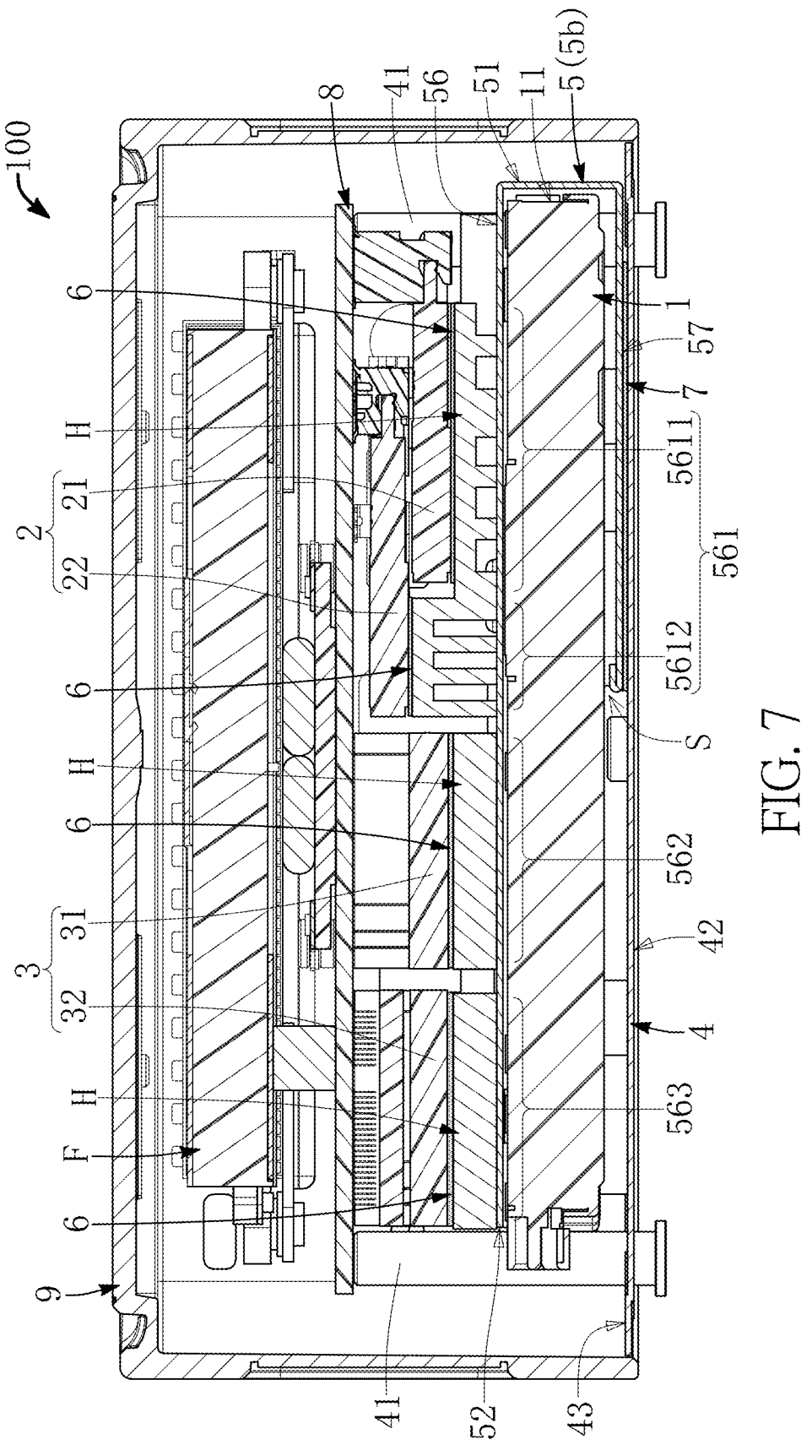
FIG. 7 is a schematic cross-sectional view of the electronic device according to a second embodiment of the present disclosure.
Figure 8:
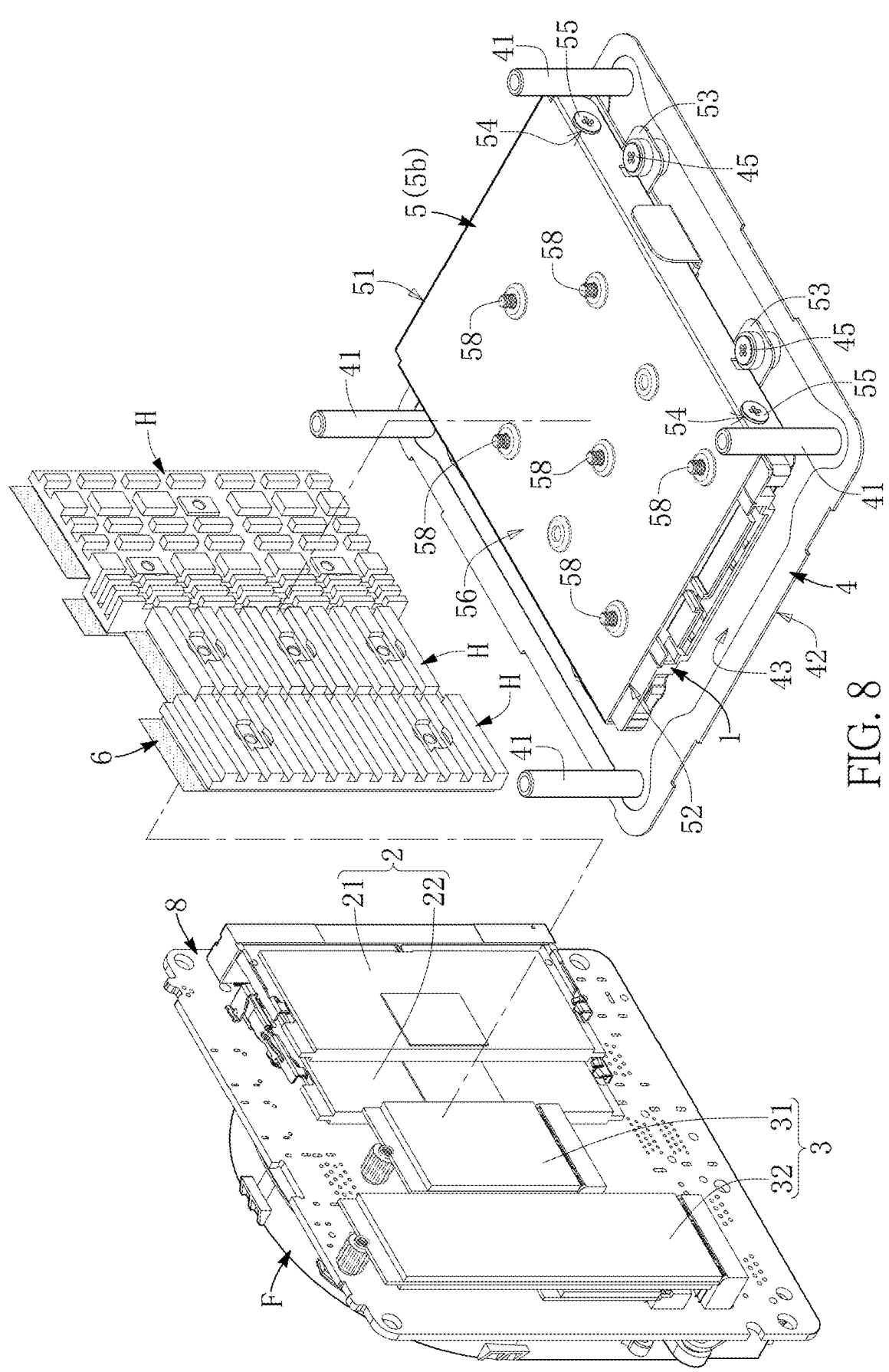
FIG. 8 is a schematic exploded view of FIG. 7 in which the housing is omitted.
Figure 9:
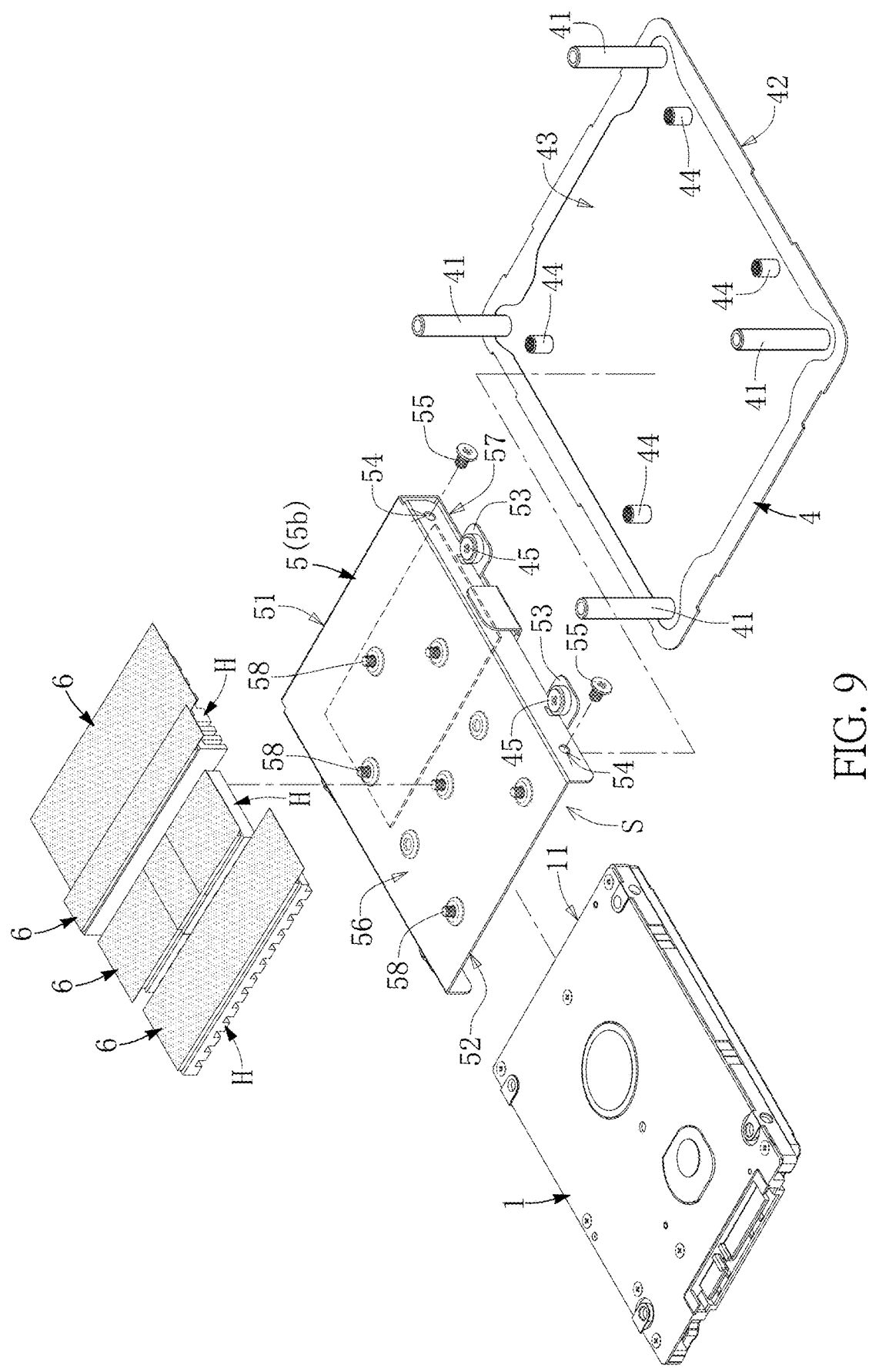
FIG. 9 is a schematic exploded view of FIG. 7 in which the housing, the fan, and the circuit board are omitted.
Figure 10:
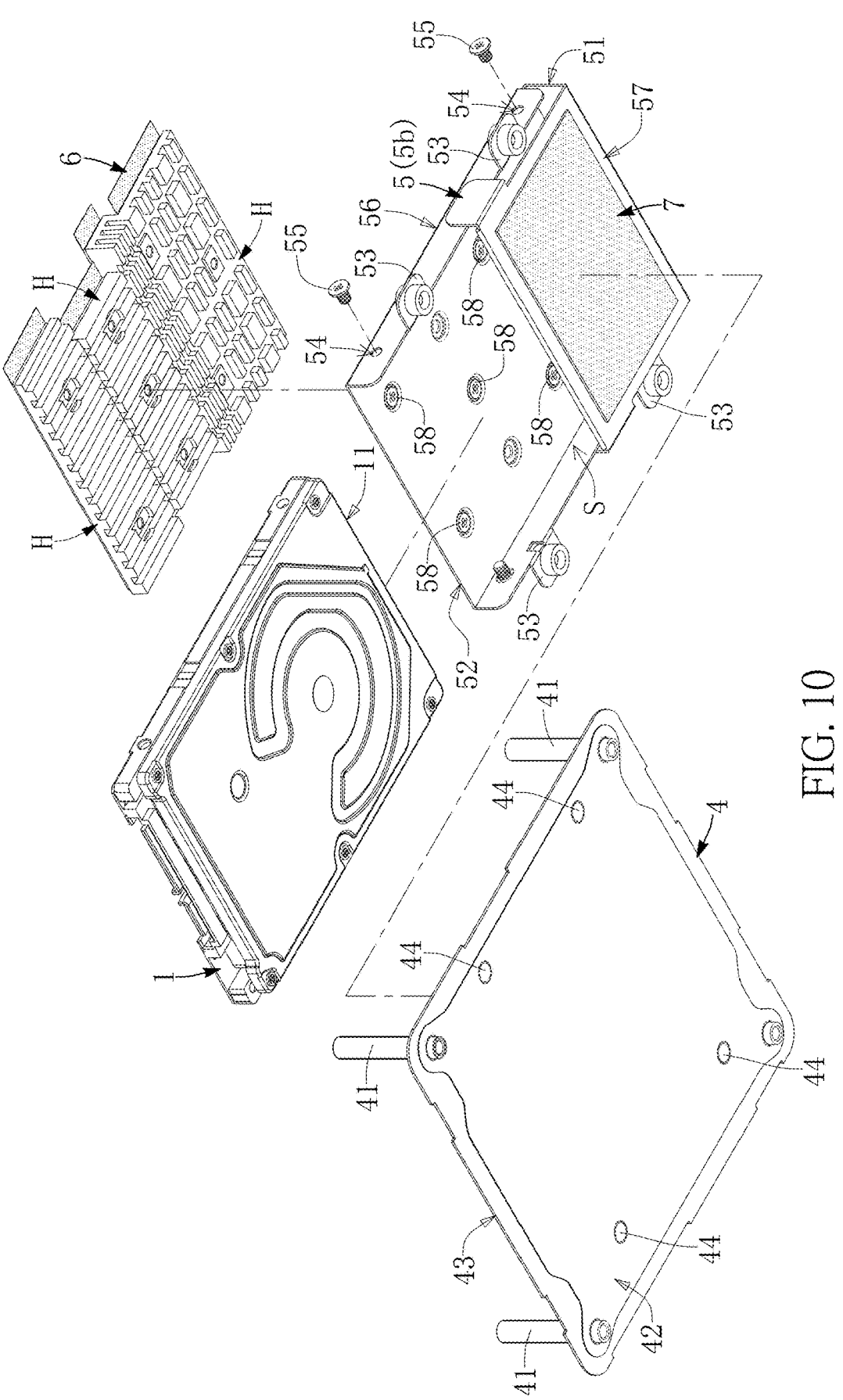
FIG. 10 is a schematic exploded view of FIG. 9 from another angle of view.

Referring to FIG. 7 and FIG. 10, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments (e.g., the metal carrier 5 and the heat-dissipation metal H).

In the present embodiment, the metal carrier 5 is a sheet metal 5*b* that is provided with the heat-dissipation metal H disposed thereon. The sheet metal 5*b* and the heat-dissipation metal H are two independent components that are detachable from each other. The sheet metal 5*b* further has a first surface 56 and a second surface 57 respectively arranged at two opposite sides of the accommodating space S. The first surface 56 is arranged adjacent to the circuit board 8, and the second surface 57 is arranged adjacent to the heat-dissipation bottom plate 4.

Moreover, the heat-dissipation metal H has a plurality of heatsinks that have different thicknesses and that are threadedly connected to the sheet metal 5*b* through fourth screws 58. A surface of the heat-dissipation metal H arranged away from the sheet metal 5*b* is provided with the first thermally conductive pads 6, and the first thermally conductive pads 6 can be connected to the memory module 2 and the at least one interface card 3 for heat dissipation.

Beneficial Effects of the Embodiments

In conclusion, in the electronic device provided by the present disclosure, the heat-dissipation bottom plate, the metal carrier, the first thermally conductive pads, and the second thermally conductive pad are structurally cooperated with each other for enabling the electronic device to be applied to electronic components (e.g., the memory modules or the interface cards) of different brands and for enabling the electronic device to provide a large heat-storage space and a large heat-dissipation area, thereby having a better heat-dissipation performance.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device for heat-dissipation of at least one of a hard disk drive (HDD), a memory module, and at least one interface card, the electronic device comprising:

a heat-dissipation bottom plate;

a metal carrier disposed on the heat-dissipation bottom plate and having an accommodating space that allows the HDD to be assembled therein, wherein the metal carrier has a first surface and a second surface respectively arranged at two opposite sides of the accommodating space;

a plurality of first thermally conductive pads assembled to the first surface of the metal carrier, wherein the memory module and the at least one interface card are connected to the metal carrier through the first thermally conductive pads; and a second thermally conductive pad assembled to the second surface of the metal carrier, wherein the metal carrier or the HDD is connected to the heat-dissipation bottom plate through the second thermally conductive pad;

wherein the HDD, the memory module, and the at least one interface card are in cooperation with the first thermally conductive pads, the metal carrier, the second thermally conductive pad, and the heat-dissipation bottom plate for heat-dissipation.

2. The electronic device according to claim 1, wherein the first surface has a first portion and a second portion that is arranged adjacent to the first portion, wherein the first portion is configured to carry the memory module, and the second portion is configured to carry the at least one interface card, wherein the first surface further has a third portion, the second portion is arranged between the first portion and the third portion, and the at least one interface card includes a first interface card having a first size and a second interface card that has a second size being different from the first size, and wherein the first interface card is disposed on the second portion, and the second interface card is disposed on the third portion.

3. The electronic device according to claim 1, further comprising a circuit board arranged above the heat-dissipation bottom plate, wherein a fan is assembled to a top side of the circuit board, and the memory module and the at least one interface card are assembled to a bottom side of the circuit board.

4. The electronic device according to claim 1, wherein the memory module is a small outline dual in-line memory module (SODIMM), and the at last one interface card is a M.2 solid state drive (SSD).

5. The electronic device according to claim 4, wherein the memory module includes a first memory and a second memory that is stacked on the first memory, wherein the first memory and the second memory are parallel to each other and are disposed on the first surface, and the first surface has a first stair and a second stair that is connected to the first stair, and wherein the first stair and the second stair are arranged at different heights, the first stair is configured to carry the first memory, the second stair is configured to carry the second memory, and the first memory and the second memory are thermally conductive through the first stair and the second stair, respectively.

6. The electronic device according to claim 5, wherein the metal carrier has a front segment and a rear segment, and wherein the HDD is inserted into the accommodating space through a front edge of the HDD, the front edge is located adjacent to the front segment, and the first stair and the second stair are arranged on the front segment.

7. The electronic device according to claim 1, wherein the electronic device is a handheld electronic device that includes a housing covering the heat-dissipation bottom plate, and wherein the heat-dissipation bottom plate has an outer surface arranged away from the metal carrier and exposed from the handheld electronic device.

8. The electronic device according to claim 1, further comprising at least one heat-dissipation metal configured to be connected to at least one of the memory module and the at least one interface card, wherein the memory module and the at least one interface card are in heat-dissipation sequentially through one of the at least one heat-dissipation metal and the first thermally conductive pads.

9. The electronic device according to claim 1, wherein the metal carrier is an aluminum extrusion or a sheet metal.

10. The electronic device according to claim 1, wherein the metal carrier is an aluminum extrusion, and the electronic device further includes at least one heat-dissipation metal, and wherein the aluminum extrusion and the at least one heat-dissipation metal are integrally formed as a single one-piece structure.

* * * * *